US008343792B2

(12) United States Patent
Carothers et al.

(10) Patent No.: US 8,343,792 B2
(45) Date of Patent: Jan. 1, 2013

(54) METHOD FOR MANUFACTURING LATERAL GERMANIUM DETECTORS

(75) Inventors: Daniel N. Carothers, Oro Valley, AZ (US); Craig M. Hill, Warrenton, VA (US); Andrew T. S. Pomerene, Leesburg, VA (US); Vu A. Vu, Falls Church, VA (US); Robert Kamocsai, Manassas, VA (US); Timothy J. Conway, Gainesville, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 390 days.

(21) Appl. No.: 12/521,853

(22) PCT Filed: Oct. 27, 2008

(86) PCT No.: PCT/US2008/081305
§ 371 (c)(1),
(2), (4) Date: Feb. 9, 2010

(87) PCT Pub. No.: WO2009/055778
PCT Pub. Date: Mar. 30, 2009

(65) Prior Publication Data
US 2012/0252158 A1    Oct. 4, 2012

Related U.S. Application Data

(60) Provisional application No. 61/000,346, filed on Oct. 25, 2007.

(51) Int. Cl.
*H01L 21/00* (2006.01)
(52) U.S. Cl. ............ 438/57; 438/96; 438/478; 257/431; 257/458

(58) Field of Classification Search .................... None
See application file for complete search history.

(56) References Cited

U.S. PATENT DOCUMENTS 4,420,258 A     12/1983   Burns et al.
(Continued)

FOREIGN PATENT DOCUMENTS

EP       0 818 693        1/1998
(Continued)

OTHER PUBLICATIONS

Colace et at., Efficient high-speed near-infrared Ge photodetectors integrated on Si substrates, Applied Physics Letters, vol. 76, p. 1231 et seq., 2000.*

(Continued)

*Primary Examiner* — Evan Pert
*Assistant Examiner* — Andres Munoz
(74) *Attorney, Agent, or Firm* — Yudell Isidore Ng Russell; Antony P. Ng; Daniel J. Long

(57) ABSTRACT

An improved method for manufacturing a lateral germanium detector is disclosed. A detector window is opened through an oxide layer to expose a doped single crystalline silicon layer situated on a substrate. Next, a single crystal germanium layer is grown within the detector window, and an amorphous germanium layer is grown on the oxide layer. The amorphous germanium layer is then polished to leave only a small portion around the single crystal germanium layer. A dielectric layer is deposited on the amorphous germanium layer and the single crystal germanium layer. Using resist masks and ion implants, multiple doped regions are formed on the single crystal germanium layer. After opening several oxide windows on the dielectric layer, a refractory metal layer is deposited on the doped regions to form multiple germanide layers.

10 Claims, 9 Drawing Sheets

U.S. PATENT DOCUMENTS

| | | | |
|---|---|---|---|
| 4,547,072 | A | 10/1985 | Yoshida et al. |
| 4,748,617 | A | 5/1988 | Drewlo |
| 4,921,354 | A | 5/1990 | SooHoo |
| 5,165,001 | A | 11/1992 | Takagi et al. |
| 5,281,805 | A | 1/1994 | Sauer |
| 5,371,591 | A | 12/1994 | Martin et al. |
| 5,430,755 | A | 7/1995 | Perlmutter |
| 5,625,636 | A | 4/1997 | Bryan et al. |
| 5,674,778 | A | 10/1997 | Lee et al. |
| 5,703,989 | A | 12/1997 | Khan et al. |
| 5,736,461 | A | 4/1998 | Berti et al. |
| 5,810,924 | A | 9/1998 | Legoues et al. |
| 5,828,476 | A | 10/1998 | Bonebright et al. |
| 5,834,800 | A | 11/1998 | Jalali-Farahani et al. |
| 5,994,724 | A * | 11/1999 | Morikawa ............... 257/184 |
| 6,117,771 | A | 9/2000 | Murphy et al. |
| 6,242,324 | B1 | 6/2001 | Kub et al. |
| 6,331,445 | B1 | 12/2001 | Janz et al. |
| 6,387,720 | B1 | 5/2002 | Misheloff et al. |
| 6,400,996 | B1 | 6/2002 | Hoffberg et al. |
| 6,477,285 | B1 | 11/2002 | Shanley |
| 6,605,809 | B1 | 8/2003 | Engels et al. |
| 6,677,655 | B2 | 1/2004 | Fitzergald |
| 6,680,495 | B2 | 1/2004 | Fitzergald |
| 6,723,622 | B2 * | 4/2004 | Murthy et al. ............... 438/507 |
| 6,738,546 | B2 | 5/2004 | Deliwala |
| 6,785,447 | B2 | 8/2004 | Yoshimura et al. |
| 6,795,622 | B2 | 9/2004 | Forrest et al. |
| 6,850,252 | B1 | 2/2005 | Hoffberg |
| 6,861,369 | B2 | 3/2005 | Park |
| 6,936,839 | B2 | 8/2005 | Taylor |
| 6,968,110 | B2 | 11/2005 | Patel et al. |
| 7,006,881 | B1 | 2/2006 | Hoffberg et al. |
| 7,008,813 | B1 | 3/2006 | Lee et al. |
| 7,010,208 | B1 | 3/2006 | Gunn, III et al. |
| 7,043,106 | B2 | 5/2006 | West et al. |
| 7,072,556 | B1 | 7/2006 | Gunn, III et al. |
| 7,082,247 | B1 | 7/2006 | Gunn, III et al. |
| 7,103,252 | B2 | 9/2006 | Ide |
| 7,139,448 | B2 | 11/2006 | Jain et al. |
| 7,215,845 | B1 | 5/2007 | Chan et al. |
| 7,218,809 | B2 | 5/2007 | Zhou et al. |
| 7,218,826 | B1 | 5/2007 | Gunn, III et al. |
| 7,259,031 | B1 | 8/2007 | Dickinson et al. |
| 7,272,279 | B2 | 9/2007 | Ishikawa et al. |
| 7,315,679 | B2 | 1/2008 | Hochberg et al. |
| 7,333,679 | B2 | 2/2008 | Takahashi |
| 7,348,230 | B2 | 3/2008 | Matsuo et al. |
| 7,356,221 | B2 | 4/2008 | Chu et al. |
| 7,736,934 | B2 * | 6/2010 | Carothers et al. ............... 438/57 |
| 2003/0026546 | A1 | 2/2003 | Deliwala |
| 2003/0104658 | A1 * | 6/2003 | Furukawa et al. ............ 438/151 |
| 2003/0183825 | A1 | 10/2003 | Morse |
| 2004/0146431 | A1 | 7/2004 | Scherer et al. |
| 2004/0190274 | A1 | 9/2004 | Saito et al. |
| 2005/0094938 | A1 | 5/2005 | Ghiron et al. |
| 2005/0127275 | A1 * | 6/2005 | Yang ............... 250/214 R |
| 2005/0184354 | A1 * | 8/2005 | Chu et al. ............... 257/458 |
| 2006/0158723 | A1 | 7/2006 | Voigt et al. |
| 2006/0238866 | A1 | 10/2006 | Von Lerber |
| 2006/0240667 | A1 | 10/2006 | Matsuda et al. |
| 2007/0099315 | A1 * | 5/2007 | Maa et al. ............... 438/22 |
| 2007/0116398 | A1 | 5/2007 | Pan et al. |
| 2007/0200181 | A1 | 8/2007 | Rhodes |
| 2007/0202254 | A1 | 8/2007 | Ganguli et al. |
| 2008/0159751 | A1 | 7/2008 | Matsui et al. |
| 2008/0240180 | A1 | 10/2008 | Matsui et al. |
| 2011/0147870 | A1 * | 6/2011 | Ang et al. ............... 257/432 |

FOREIGN PATENT DOCUMENTS

| | | |
|---|---|---|
| EP | 1 067 409 | 1/2001 |
| WO | 9314514 | 7/1993 |
| WO | 0127669 | 4/2001 |
| WO | 0216986 | 2/2002 |
| WO | 2004088724 | 10/2004 |
| WO | 2007149055 | 12/2007 |

OTHER PUBLICATIONS

Dehlinger et al., High-speed germanium-on-SOI lateral PIN photodiodes, IEEE Photon. Technol. Lett., vol. 16, pp. 2547 2004.*

Kimmet, J. S., "M.S. Thesis: Integrated Circuit Fabrication Details," Rutgers University, 1999; 18 pp.

Pruessner et al., "InP-Based Optical Waveguide MEMS Switches with Evanescent Coupling Mechanism", Journal of Microelectromechanical Systems, vol. 14, No. 5, Oct. 2005.

May et al., "Integrated Process for Silicon Nitride Waveguide Fabrication", IBM Technical Disclosure Bulletin, vol. 33, No. 2, Jul. 1990.

Matsushita et al., "Narrow CoSi2 Line Formation on SiO2 by Focused Ion Beam", IEEE Xplore 1999.

"Process Integration", Cobalt Self-aligned Silicide Process, Chapter 13.

Liu et al., "Design of Monolithically Integrated GeSi Electro-absorption Modulators and Photodetectors on an SOI Plaform", Optics Express 623, vol. 15, No. 2, Jan. 22, 2007.

Fijol et al., "Fabrication of Silicon-on-insulator Adiabatic Tapers for Low Loss Optical Interconnection of Photonic Devices".

Yap et al., "Integrated Opteoelectronic Circuits with InP-based HBTs", Proceedings of SPIE, vol. 4290, 2001.

Roth, "Electroabsorption Modulators for CMOS Compatible Optical Interconnects in III-V and Group IV Materials", Aug. 2007, (part 1 of 3).

Roth, "Electroabsorption Modulators for CMOS Compatible Optical Interconnects in III-V and Group IV Materials", Aug. 2007, (part 2 of 3).

Roth, "Electroabsorption Modulators for CMOS Compatible Optical Interconnects in III-V and Group IV Materials", Aug. 2007, (part 3 of 3).

Kimberling et al., "Electronic-photonic Integrated Circuits on the CMOS Platform".

Chao et al., "Analysis of Temperature Profiles of Thermo-optic Waveguides", Fiber and Integrated Optics, vol. 33.

Okyay et al., "Silicon Germanium CMOS Optoelectronic Switching Device: Bringing Light to Latch", IEEE Transactions on Electron Devices, vol. 54, No. 12, Dec. 2007.

McAulay et al., "All-optical Switching and Logic with an Integrated Optic Microring Resonator", Proc. of SPIE vol. 5814.

Kik et al, "Erbium Doped Optical Waveguide Amplifiers on Silicon", MRS Bulletin 23(4), 48, Apr. 1998.

* cited by examiner

METHOD FOR MANUFACTURING LATERAL GERMANIUM DETECTORS

PRIORITY CLAIM

The present application claims benefit of priority under 35 U.S.C. §365 to the previously filed international patent application number PCT/US08/081305 filed on Oct. 27, 2008, assigned to the assignee of the present application, and having a priority date of Oct. 25, 2007, based upon U.S. provisional patent application No. 61/000,346. The contents of both applications are incorporated herein by reference.

RELATED APPLICATION

The present application is related to co-pending application Ser. No. 12/201,943 filed on Aug. 29, 2008, the contents of which are incorporated herein by reference.

STATEMENT OF GOVERNMENT INTEREST

The present invention was made with United States Government assistance under Contract No. HR0011-05-C-0027 awarded by Defense Advanced Research Projects Agency (DARPA). The United States Government has certain rights in the present invention.

BACKGROUND OF THE INVENTION

1. Technical Field

The present invention relates to optical detectors in general, and in particular to a method for manufacturing lateral germanium detectors.

2. Description of Related Art

Photodetection in the near-infrared (IR) regime has many applications, such as telecommunications, thermal imaging, etc. InGaAs-based PIN photodetectors are commonly used for telecommunication applications due to their high responsivity and speed. However, the majority of the InGaAs-based detectors are normal incidence detectors, and the integration of such devices on silicon surfaces can be very expensive. Also, integration of high-speed InGaAs detectors requires special optics to focus light into a small active area, which has been found to reduce device performance.

Germanium-based detectors are known to be a suitable alternative. However, germanium-based detectors exhibit a higher dark current than InGaAs-based detectors, which limit their application in the telecommunications industry. In recent years, attempts have been made to improve the performance of polycrystalline germanium-based detectors for these applications. One exemplary prior art poly-germanium detector is described by Colace et al. in an article entitled *Efficient high-speed near-infrared Ge photodetectors integrated on Si substrates* (Applied Physics Letters, vol. 76, p. 1231 et seq., 2000).

The present disclosure provides an improved method for manufacturing lateral germanium-based detectors.

SUMMARY OF THE INVENTION

In accordance with a preferred embodiment of the present invention, a detector window is opened through an oxide layer to expose a doped single crystalline silicon layer located on a substrate. Next, a single crystal germanium layer is grown within the detector window, and an amorphous germanium layer is grown on the oxide layer. The amorphous germanium layer is then polished to leave only a small portion around the single crystal germanium layer. A dielectric layer is deposited on the amorphous germanium layer and the single crystal germanium layer. Using resist masks and implants, doped regions are formed on the single crystal germanium layer. After opening several oxide windows on the dielectric layer, a refractory metal layer is deposited on the doped regions to form multiple germanide layers.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
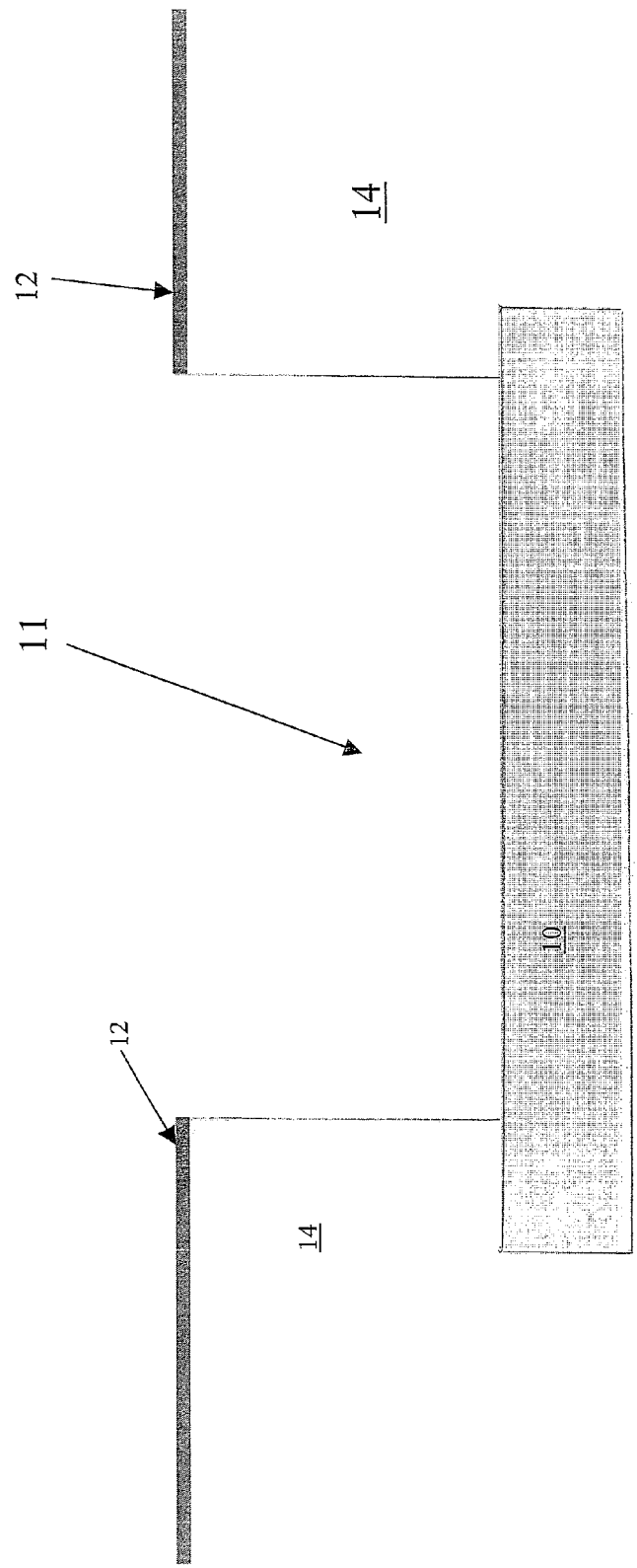
FIGS. 1-9 illustrate successive steps of a method for fabricating a lateral germanium-based detector, in accordance with a preferred embodiment of the present invention.

Referring now to the drawings and in particular to FIGS. 1-9, there are illustrated successive steps of a method for fabricating a lateral germanium-based detector, in accordance with a preferred embodiment of the present invention. Initially, a dry etch process is utilized to open a detector window 11 through a nitride layer 12 (~250 Å) and an oxide layer 14 (~6,000 Å) to expose a single crystalline silicon layer 10 situated on an insulator substrate, as shown in FIG. 1.

Figure 2:
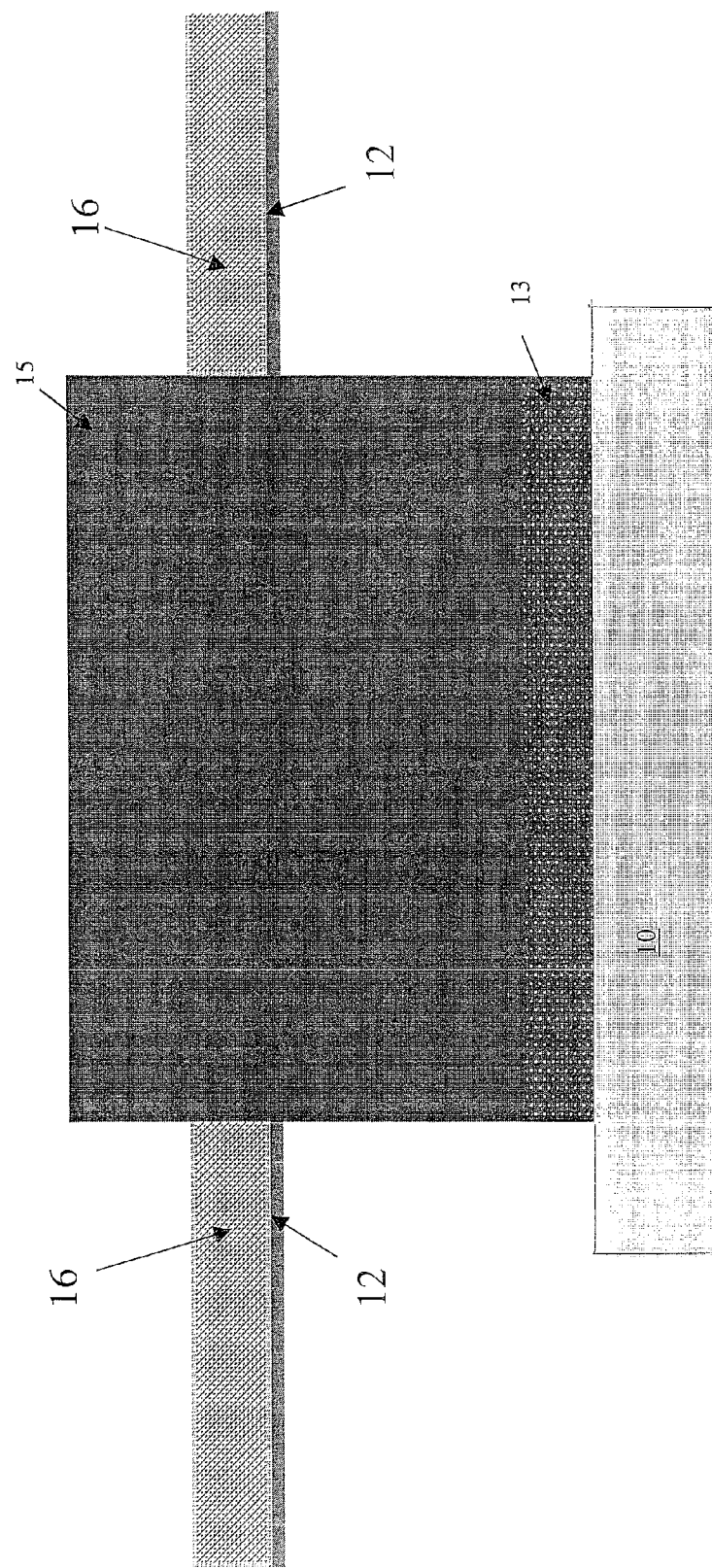

A single crystal germanium layer 15 is then grown within detector window 11, as depicted in FIG. 2. Four different gases are used for the growth of single crystal germanium layer 15, namely, hydrogen, 100% silane ($SiH_4$), 100% germane ($GeH_4$), and 100% diborane ($B_2H_6$). The germanium growth process uses silicon and silicon-germanium seed layers to create an abrupt transition from the underlying single crystal silicon surface and the single crystal germanium growth. The usage of the seed layers allows for a subsequent single crystal germanium growth, even across very large exposed single crystal silicon regions. For the present embodiment, the bottom portion of the germanium growth is in-situ doped with boron at a concentration of approximately $1 \times E^{21}$ atoms/cm$^3$. The boron concentration is graded with the highest concentration at the bottom of single crystal germanium layer 15 as a doped germanium layer 13.

Because of the usage of the silicon seed layer, the germanium growth is not completely selective, and some germanium can form over nitride layer 12 as an amorphous germanium layer 16, as depicted in FIG. 2. Amorphous germanium layer 16 may serve as a sacrificial polish layer for subsequent processing.

Doped germanium layer 13 minimizes the electric fields at the bottom of single crystal germanium layer 15, which can decrease detector noise and dark currents caused by defects commonly located at the bottom of single crystal germanium layer 15. The boron in doped germanium layer 13 can be replaced by other dopants.

Figure 3:
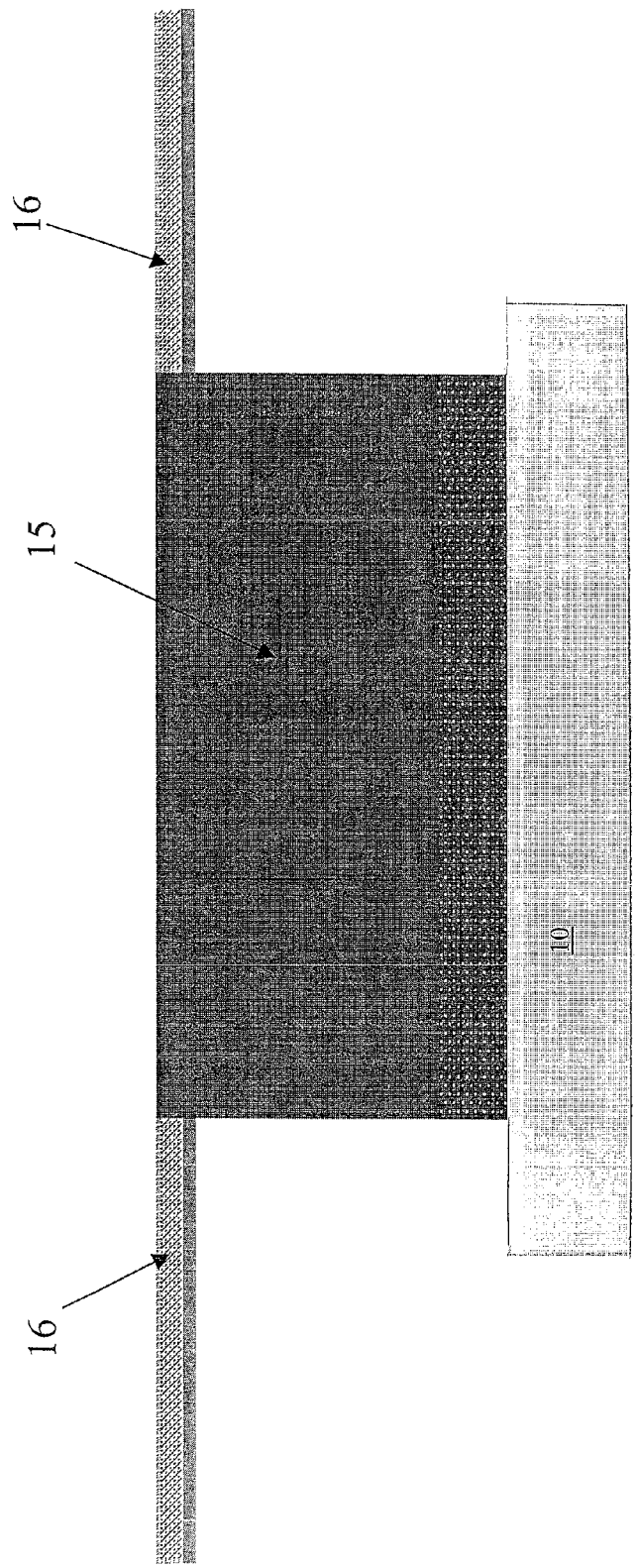

Single crystal germanium layer 15 and amorphous germanium layer 16 are then polished via a chemical mechanical polish (CMP), as shown in FIG. 3. It is preferable to stop the CMP process before amorphous germanium layer 16 is completely removed. This is because polishing too far can expose voids and crystalline defects that tend to form at the edge of detector window 11 (from FIG. 1) and single crystal germanium layer 15, and polishing too close to the crystalline defects can create voids by tearing out entire crystalline defects.

Figure 4:
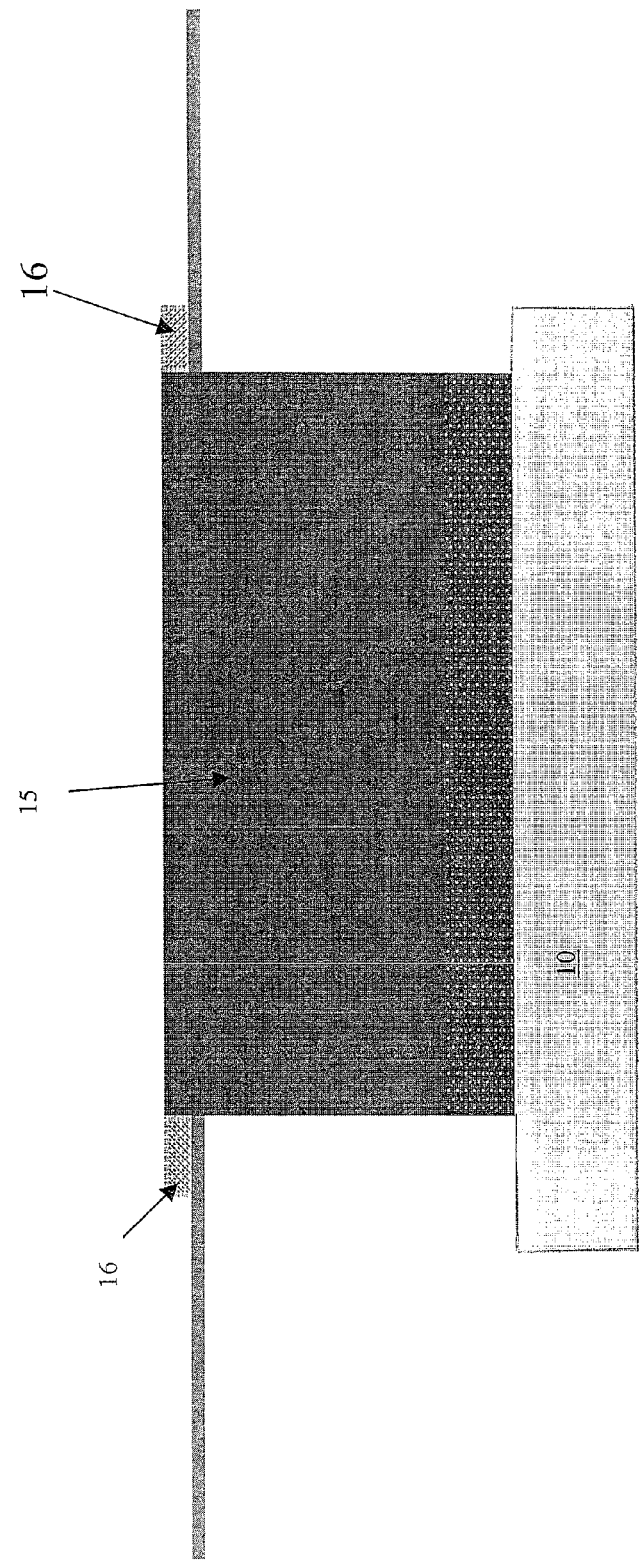

Using a mask, the remaining portion of amorphous germanium layer 16 is removed via a dry etch, leaving a portion of amorphous germanium layer 16 located around single crystal germanium layer 15, as depicted in FIG. 4.

Figure 5:
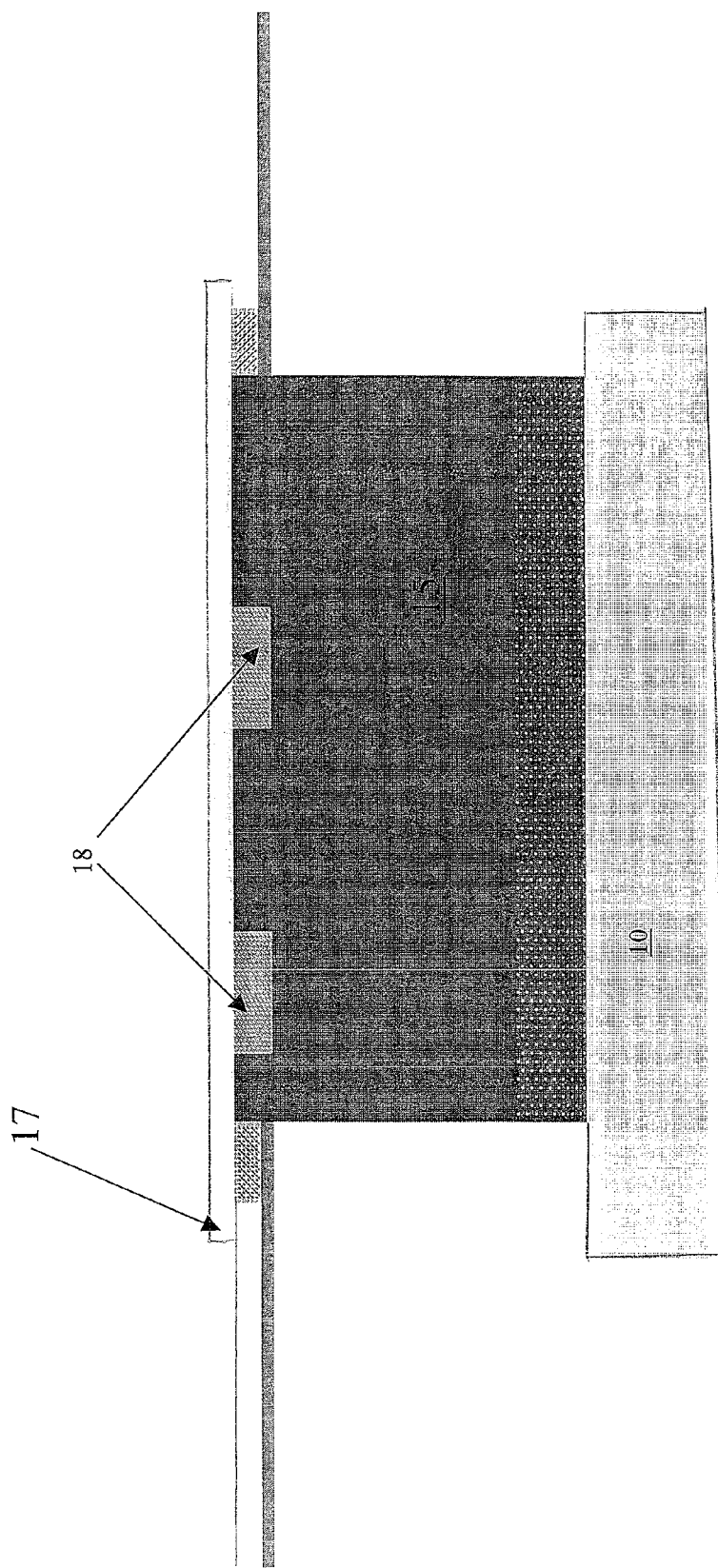

After a tetraethyl orthosilicate (TEOS) layer 17 has been deposited on single crystal germanium layer 15 and amorphous germanium layer 16, multiple n+ implant regions 18 are formed on single crystal germanium layer 15, as shown in FIG. 5, via an appropriate mask and ion implants.

TEOS layer 17 may be replaced by other types of oxides or dielectrics including nitride. For example, germanium oxy-nitride can be used instead of TEOS in layer 17 in order to lower the stress over amorphous germanium layer 16, which should reduce noise and dark current. TEOS layer 17 is utilized to seal the edge of a germanium detector at which defects and voids are most prone to be formed.

Figure 6:
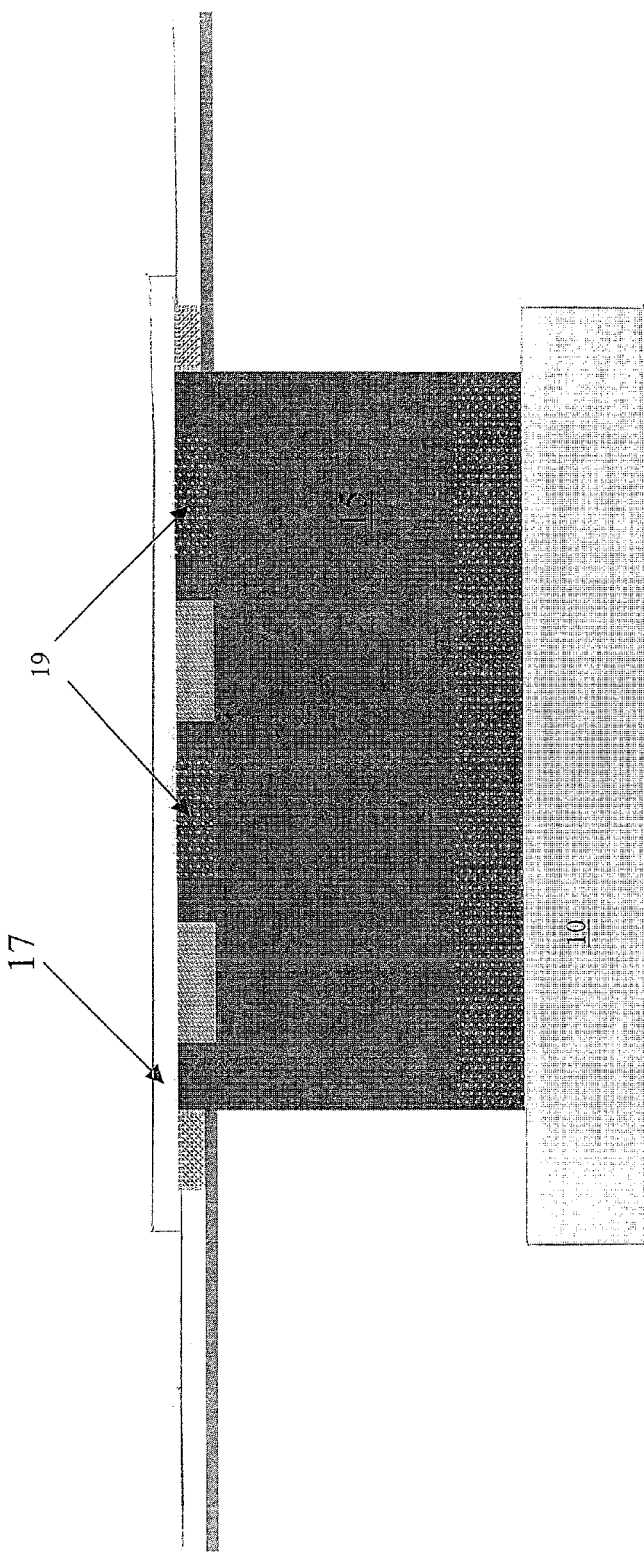

Next, multiple p+ doped germanium regions 19 are formed on single crystal germanium layer 15, as depicted in FIG. 6, via a mask. All n+ implant regions 18 and p+ doped germanium regions 19 can be activated via annealing. Preferably, implant masks are utilized to keep the n+ and p+ dopants away from the defects and voids at the edge of single crystal germanium layer 15. Keeping the n+ and p+ dopants away from the defect-prone edge regions can decrease detector noise and dark current.

Figure 7:
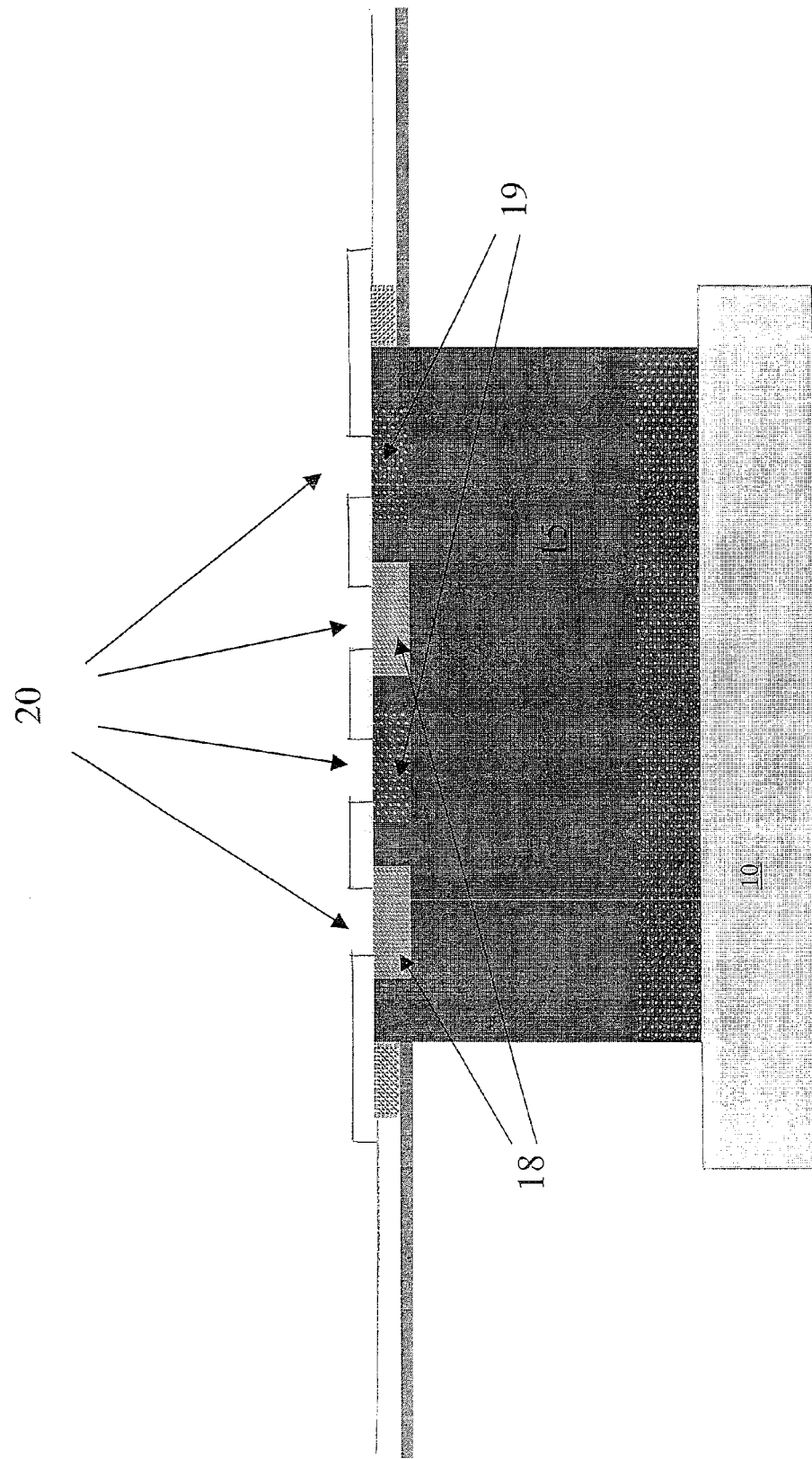

TEOS (or germanium oxy-nitride) layer 17 is then patterned using a resist mask, and a dry etch is utilized to open multiple oxide windows 20, as shown in FIG. 7. Oxide windows 20 expose n+ implant regions 18 and p+ doped germanium regions 19 for respective germanide formations later.

Figure 8:
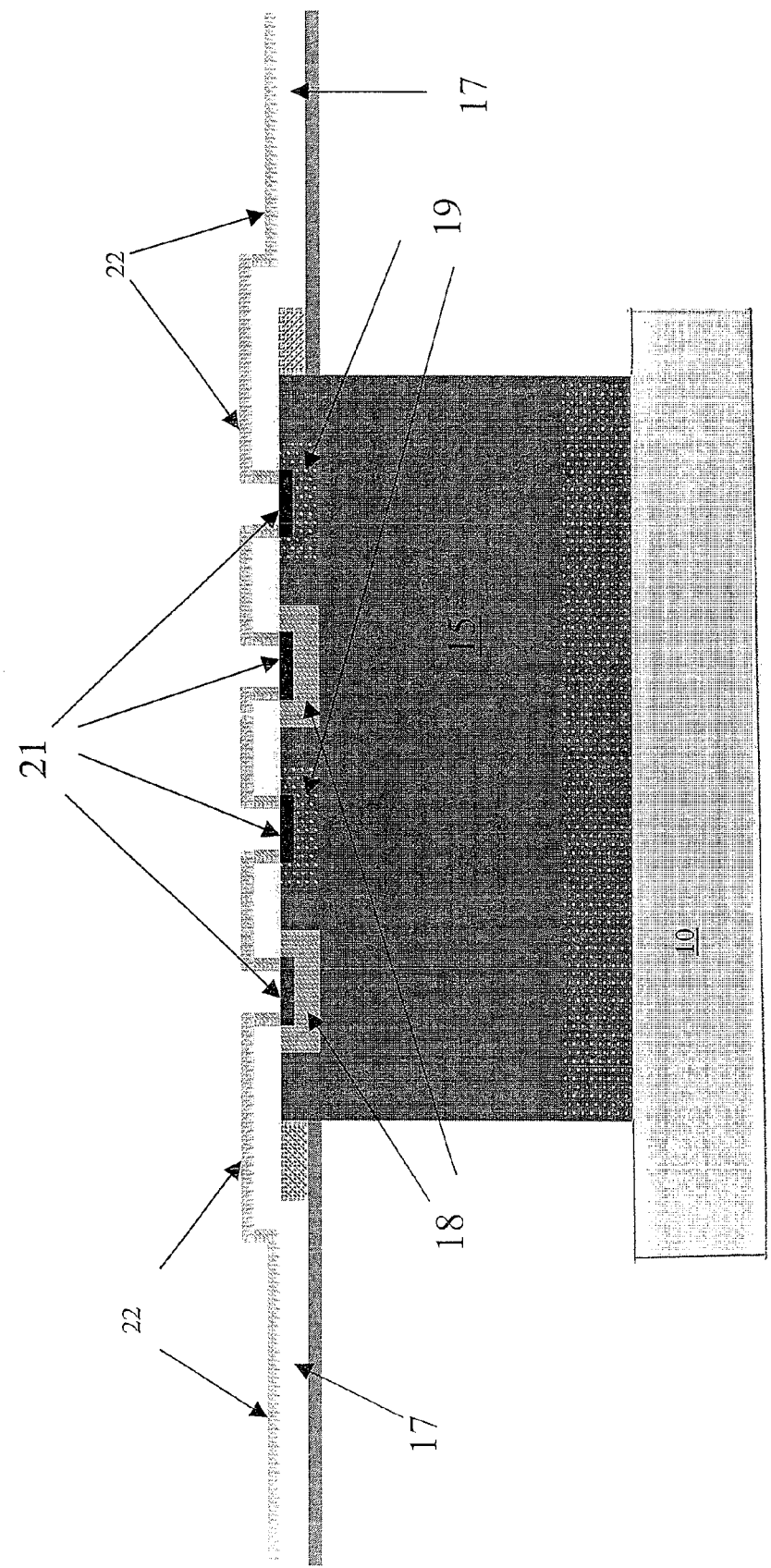

A titanium deposition is performed on n+ implant regions 18 and p+ doped germanium regions 19 that are exposed through oxide windows 20. One or more heat treatments are then utilized to form TiGe material 21 within oxide windows 20, as depicted in FIG. 8. Since no TiGe can be formed over TEOS layer 17, non-reacted Ti layer 22 remains to be situated on top of TEOS layer 17, as depicted in FIG. 8.

Figure 9:
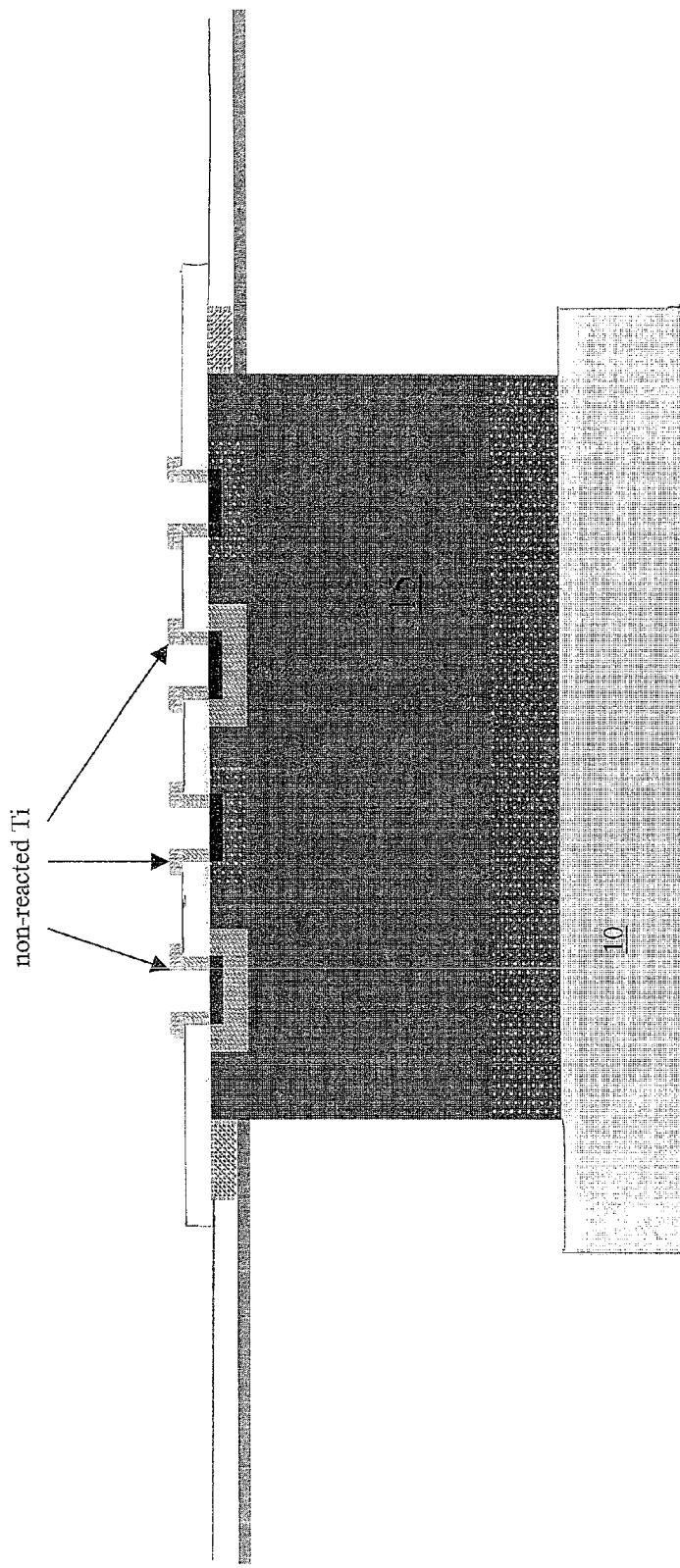

The remaining non-reacted Ti layer 22 located on top of TEOS layer 17 may be removed using a resist mask and dry etch, as depicted in FIG. 9. Alternatively, the remaining non-reacted Ti layer 22 located on top of TEOS layer 17 may be removed with a wet strip. Generally, a wet strip is not the preferred choice because there is some risk that the wet strip may remove TiGe material 21 or create pits in single crystal germanium layer 15. The processing options are not limited to titanium germanide as any refractory metal may be used to form the germanide.

At this point, a P-i-N germanium detector having a lateral configuration is formed, and conventional semiconductor processing techniques can be utilized to fabricate dielectrics and contacts at the top of the P-i-N germanium detector. The detector shown in FIG. 9 may be used to detect light from above single crystal germanium layer 15, and may be configured as a focal plane array. Alternatively, the detector shown in FIG. 9 may be configured to detect light from an underlying waveguide by using single crystalline silicon layer 10 as the end of a waveguide. The detector shown in FIG. 9 may also be configured as a butt coupled device where the light comes from a waveguide that is coupled from the side of single crystal germanium layer 15.

As has been described, the present invention provides an improved method for manufacturing a lateral germanium detector.

While the invention has been particularly shown and described with reference to a preferred embodiment, it will be understood by those skilled in the art that various changes in form and detail may be made therein without departing from the spirit and scope of the invention.

What is claimed is:

1. A method for fabricating a lateral germanium detector, said method comprising:
opening a detector window through an oxide layer to expose a single crystalline silicon layer situated on a substrate;
growing a single crystal germanium layer within said detector window, and an amorphous germanium layer on said oxide layer;
polishing and removing said amorphous germanium layer until a portion of said amorphous germanium layer is located around said single crystal germanium layer;
depositing a dielectric layer on said amorphous germanium layer and said single crystal germanium layer;
forming a plurality of doped regions on said single crystal germanium layer;
opening a plurality of oxide windows on said dielectric layer; and
depositing a refractory metal layer on said plurality of doped regions to form a plurality of germanide layers.

2. The method of claim 1, wherein said lateral germanium detector is in a P-i-N configuration.

3. The method of claim 1, wherein said lateral germanium detector includes and a p+ doped germanium layer.

4. The method of claim 1, wherein said germanium detector includes and an n+ doped germanium layer.

5. The method of claim 1, wherein said dielectric (TEOS) layer is a tetraethyl orthosilicate layer.

6. The method of claim 1, wherein said dielectric layer is a germanium oxy-nitride layer.

7. The method of claim 1, wherein said dielectric layer is a silicon nitride layer.

8. The method of claim 1, wherein said plurality of doped regions are confined within said detector window.

9. The method of claim 1, wherein said refractory metal deposition is confined within said detector window.

10. The method of claim 1, wherein said amorphous germanium layer is completely removed in region located around said single crystal germanium layer.

* * * * *